(12) United States Patent
Fuse et al.

(10) Patent No.: US 10,315,394 B2
(45) Date of Patent: Jun. 11, 2019

(54) SUBSTRATE FOR SURFACE PROTECTIVE SHEET AND SURFACE PROTECTIVE SHEET

(71) Applicant: LINTEC CORPORATION, Itabashi-ku (JP)

(72) Inventors: Keishi Fuse, Toda (JP); Kazuyuki Tamura, Phoenix, AZ (US); Shigeto Okuji, Koshigaya (JP)

(73) Assignee: LINTEC CORPORATION, Itabashi-ku (JP)

( * ) Notice: Subject to any disclaimer, the term of this patent is extended or adjusted under 35 U.S.C. 154(b) by 59 days.

(21) Appl. No.: 15/519,059

(22) PCT Filed: Oct. 19, 2015

(86) PCT No.: PCT/JP2015/079425
§ 371 (c)(1),
(2) Date: Apr. 13, 2017

(87) PCT Pub. No.: WO2016/063827
PCT Pub. Date: Apr. 28, 2016

(65) Prior Publication Data
US 2017/0239923 A1 Aug. 24, 2017

(30) Foreign Application Priority Data
Oct. 20, 2014 (JP) .................. 2014-214074

(51) Int. Cl.
*B32B 27/20* (2006.01)
*B32B 27/30* (2006.01)
(Continued)

(52) U.S. Cl.
CPC ............... *B32B 27/20* (2013.01); *B32B 7/04* (2013.01); *B32B 7/05* (2019.01); *B32B 25/08* (2013.01);
(Continued)

(58) Field of Classification Search
CPC ............ B32B 2250/03; B32B 2250/24; B32B 2250/44; B32B 2264/102;
(Continued)

(56) References Cited

U.S. PATENT DOCUMENTS

2004/0005136 A1*  1/2004  Okumura ............... G02B 1/105
                                                    385/147
2007/0066184 A1    3/2007  Nagamoto et al.
(Continued)

FOREIGN PATENT DOCUMENTS

CN      1868040 A    11/2006
JP      2007-99984    4/2007
(Continued)

OTHER PUBLICATIONS

International Search Report dated Jan. 19, 2016, in PCT/JP2015/079425 filed Oct. 19, 2015.
(Continued)

*Primary Examiner* — Thao T Tran
(74) *Attorney, Agent, or Firm* — Oblon, McClelland, Maier & Neustadt, L.L.P.

(57) ABSTRACT

The substrate for surface protective sheet of the present invention is a substrate for surface protective sheet including a support film and an antistatic layer provided on one face of the support film, wherein a stress relaxation rate of the substrate for surface protective sheet is 60% or more; the antistatic layer is one formed by curing an antistatic layer-forming composition containing a curing component and a metal filler; and the content of a metal filler is 55 mass % or more relative to the total mass of the curing component and the metal filler, and the curing component includes a urethane acrylate oligomer.

6 Claims, 1 Drawing Sheet

(51) Int. Cl.
- *B32B 27/40* (2006.01)
- *B32B 27/18* (2006.01)
- *H01L 21/683* (2006.01)
- *C09J 7/25* (2018.01)
- *B32B 7/04* (2019.01)
- *B32B 25/08* (2006.01)
- *B32B 27/06* (2006.01)
- *B32B 27/08* (2006.01)
- *B32B 27/24* (2006.01)
- *B32B 27/28* (2006.01)
- *B32B 7/05* (2019.01)

(52) U.S. Cl.
CPC .............. *B32B 27/06* (2013.01); *B32B 27/08* (2013.01); *B32B 27/18* (2013.01); *B32B 27/24* (2013.01); *B32B 27/283* (2013.01); *B32B 27/285* (2013.01); *B32B 27/30* (2013.01); *B32B 27/308* (2013.01); *B32B 27/40* (2013.01); *C09J 7/25* (2018.01); *H01L 21/6836* (2013.01); *B32B 2250/03* (2013.01); *B32B 2250/24* (2013.01); *B32B 2250/44* (2013.01); *B32B 2264/102* (2013.01); *B32B 2264/105* (2013.01); *B32B 2264/12* (2013.01); *B32B 2270/00* (2013.01); *B32B 2307/21* (2013.01); *B32B 2307/50* (2013.01); *B32B 2307/54* (2013.01); *B32B 2307/546* (2013.01); *B32B 2307/732* (2013.01); *B32B 2405/00* (2013.01); *B32B 2457/14* (2013.01); *C09J 2201/606* (2013.01); *C09J 2201/622* (2013.01); *C09J 2203/326* (2013.01); *H01L 2221/6834* (2013.01)

(58) Field of Classification Search
CPC .......... B32B 2264/105; B32B 2307/21; B32B 2307/50; B32B 2307/54; B32B 2307/546; B32B 2307/732; B32B 2405/00; B32B 2457/14; B32B 25/08; B32B 27/06; B32B 27/08; B32B 27/20; B32B 27/24; B32B 27/283; B32B 27/285; B32B 27/30; B32B 27/308; B32B 27/40; B32B 7/04; B32B 7/05; C09J 2201/606; C09J 2201/622; C09J 2203/326; C09J 7/25; H01L 21/6836; H01L 2221/6834
USPC .......................... 428/423.1, 423.3; 526/931
See application file for complete search history.

(56) References Cited

U.S. PATENT DOCUMENTS

| | | | |
|---|---|---|---|
| 2009/0081852 A1* | 3/2009 | Tanaka | B24B 37/042 438/464 |
| 2012/0171444 A1* | 7/2012 | Haruta | B32B 27/08 428/217 |
| 2014/0170362 A1* | 6/2014 | Ali | C09J 133/14 428/41.8 |

FOREIGN PATENT DOCUMENTS

| | | |
|---|---|---|
| JP | 2008-50480 A | 3/2008 |
| JP | 2009-35680 A | 2/2009 |
| JP | 2010-177542 A | 8/2010 |
| JP | 2011-210944 A | 10/2011 |
| JP | 2012-41245 A | 3/2012 |

OTHER PUBLICATIONS

Office Action dated Jan. 31, 2019 issued in corresponding Chinese patent application No. 201580055158.1.

* cited by examiner

SUBSTRATE FOR SURFACE PROTECTIVE SHEET AND SURFACE PROTECTIVE SHEET

TECHNICAL FIELD

The present invention relates to a surface protective sheet which is stuck onto an adherend surface to protect the adherend surface and a substrate thereof, and in particular, the present invention relates to a surface protective sheet for semiconductor wafer to be used upon being stuck onto a wafer front face for the purpose of protecting a circuit or the like formed on the wafer front face and a substrate thereof.

BACKGROUND ART

In a semiconductor wafer, it is general that after forming a circuit on its front face, in order to adjust a wafer thickness, the wafer back face side is subjected to grinding processing. In grinding processing of the wafer back face, a surface protective sheet for protecting the circuit, which is called a back grind tape, is stuck onto the front face of the wafer.

In recent years, following advancement and complication of semiconductor products, a circuit formed on the wafer front face is liable to be influenced by static electricity. For that reason, in order to prevent releasing electrification or the like on releasing, the back grind tape has been being demanded to have an antistatic performance. In addition, following ultrathinning of a wafer in the recent years, in order to prevent wafer warpage or the like after grinding, the back grind tape is demanded to have high stress relaxation characteristics.

Then, as disclosed in PTL 1, there has hitherto been taken a technology that by not only forming a support film using a urethane-based oligomer but also blending the support film with a metal salt antistatic agent, a pressure sensitive adhesive tape is given an antistatic performance and high stress relaxation characteristics.

But, in the pressure sensitive adhesive tape of PTL 1, if the addition amount of the metal salt antistatic agent is increased, change in physical properties is caused, for example, the film rigidity is worsened, and a metal ion derived from the antistatic agent moves into a pressure sensitive adhesive and further moves into a front face circuit of a semiconductor wafer that is an adherend, thus providing a concern of causing a fault. For that reason, the pressure sensitive adhesive tape disclosed in PTL 1 involves such a problem that a high antistatic performance is hardly given.

In addition, PTLs 2 and 3 disclose that a substrate of a pressure sensitive adhesive tape for semiconductor processing is provided with, as a different layer from a support film, an antistatic layer having an antistatic agent, such as a conductive polymer, a quaternary amine salt monomer, etc., blended therein. But, likewise PTL 1, those using such a conductive polymer or quaternary amine salt monomer involve such a problem that a high antistatic performance is hardly given.

Meanwhile, PTL 4 describes that a conductive tin oxide powder having excellent conductivity can be utilized as an antistatic agent. When a metal filler disclosed in PTL 4 is, for example, used in place of the antistatic agent disclosed in PTLs 2 and 3, it is expected that the antistatic performance of a back grind tape is improved.

CITATION LIST

Patent Literature

PTL 1: JP 2010-177542 A
PTL 2: JP 2007-099984 A
PTL 3: JP 2011-210944 A
PTL 4: JP 2012-041245 A

SUMMARY OF INVENTION

Technical Problem

However, when the metal filler of PTL 4 is used for the antistatic layer disclosed in PTLs 2 and 3, in the case where the substrate has high stress relaxation characteristics, a crack is liable to be generated in the antistatic layer. Due to the generation of a crack, not only poor appearance is caused, but also the movement of an electric charge is intercepted in the crack, and therefore, even an invisible crack provokes worsening of the antistatic performance. However, heretofore, in the case of using a metal filler and providing the substrate with high stress relaxation characteristics, there has not been found any antistatic layer capable of thoroughly inhibiting the generation of a crack.

In view of the foregoing problems, the present invention has been made, and a problem thereof is to provide a substrate for surface protective sheet by, in the case of blending an antistatic layer with a metal filler, imparting high stress relaxation characteristics to the substrate, thereby enabling warpage of a wafer, as well as imparting high antistatic performance thereto by preventing the crack generation.

Solution to Problem

In order to solve the aforementioned problem, the present inventors made extensive and intensive investigations. As a result, it has been found that even in the case of using a predetermined amount or more of a metal filler in order to give a high antistatic performance and also using a substrate having high stress relaxation characteristics, by using a urethane acrylate oligomer as a curing component of an antistatic layer-forming composition, the generation of a crack in the antistatic layer can be prevented from occurring, leading to accomplishment of the present invention.

Specifically, the present invention provides the following (1) to (9).
(1) A substrate for surface protective sheet, including a support film and an antistatic layer provided on one face of the support film, wherein
a stress relaxation rate of the substrate for surface protective sheet is 60% or more,
the antistatic layer is one formed by curing an antistatic layer-forming composition containing a curing component and a metal filler,
the content of the metal filler is 55 mass % or more relative to a total mass of the curing component and the metal filler, and
the curing component includes a urethane acrylate oligomer.
(2) The substrate for surface protective sheet as set forth above in (1), wherein the urethane acrylate oligomer is selected from the group consisting of a urethane acrylate oligomer having a polyester structure and a urethane acrylate oligomer having a polyether structure.
(3) The substrate for surface protective sheet as set forth above in (1) or (2), wherein the support film is a cured urethane film obtained by curing a urethane-containing curing resin composition.
(4) The substrate for surface protective sheet as set forth above in (3), wherein the urethane-containing curing resin composition for forming the support film contains a urethane acrylate oligomer.

(5) The substrate for surface protective sheet as set forth above in any of (1) to (4), wherein the metal filler is a metal oxide filler.
(6) The substrate for surface protective sheet as set forth above in (5), wherein the metal oxide filler is a particle of phosphorus-doped tin oxide.
(7) A surface protective sheet including a pressure sensitive adhesive part on a surface of the substrate for surface protective sheet as set forth above in any of (1) to (6).
(8) The surface protective sheet as set forth above in (7), wherein the pressure sensitive adhesive part is provided on a face on the side of the substrate for surface protective sheet on which the antistatic layer is provided.
(9) The surface protective sheet as set forth above in (7) or (8), wherein the pressure sensitive adhesive part is partially provided on the substrate for surface protective sheet in such a manner that a region to be provided with a pressure sensitive adhesive part surrounds a region to be provided with no pressure sensitive adhesive part.

Advantageous Effects of Invention

According to the present invention, in the case of blending an antistatic layer with a metal filler, high antistatic performance can be obtained by preventing the crack generation, and warpage of a wafer can be suppressed by imparting high stress relaxation characteristics to the substrate.

DESCRIPTION OF EMBODIMENTS

Figure 1:
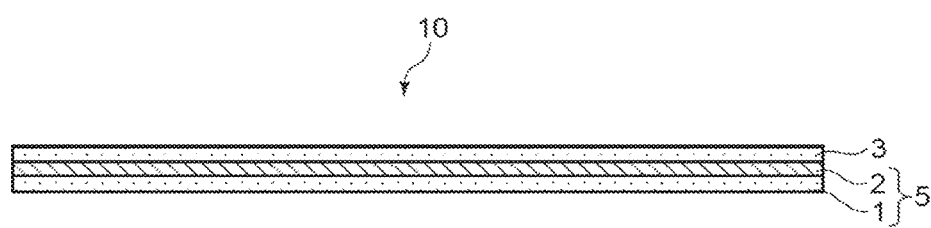
FIG. 1 shows an embodiment of a surface protective sheet of the present invention.

The present invention is hereunder described in more detail by reference to embodiments.
(Substrate for Surface Protective Sheet)
A substrate for surface protective sheet of the present invention includes a support film and an antistatic layer provided on one face of the support film. Each of the members of the substrate for surface protective sheet in the present invention is hereunder described in more detail.
In the present specification, the term "(meth)acryl" is used as a terminology meaning either one or both of "acryl" and "methacryl". In addition, the term "(meth)acrylate" is used as a terminology meaning either one or both of "acrylate" and "methacrylate", and the same is also applicable to other analogous terminologies.
[Antistatic Layer]
The antistatic layer of the present invention is one formed by curing an antistatic layer-forming composition containing a curing component and a metal filler.
<Curing Component>
The curing component is a component that undergoes polymerization and curing with energy rays or the like to form a film on the support film while holding the metal filler, and a material including a urethane acrylate oligomer as a main component is used.
In the present invention, as mentioned later, the substrate for surface protective sheet is high in its stress relaxation performance and readily extendable, and the content of the metal filler in the antistatic layer is high, and therefore, a crack is liable to be generated in the antistatic layer. In view of the fact that the antistatic layer of the present invention contains the urethane acrylate oligomer as the curing component, sufficient flexibility is given, whereby the generation of a crack in the antistatic layer can be inhibited.

The urethane acrylate oligomer is energy ray-polymerizable, has an energy ray-polymerizable double bond in a molecule thereof, and undergoes polymerization and curing upon irradiation with energy rays, such as ultraviolet rays, electron beams, etc., to form a film. Specifically, the urethane acrylate oligomer is a compound having a (meth)acryloyl group and a urethane bond.

The urethane acrylate oligomer is, for example, one obtained by allowing an isocyanate-terminated urethane prepolymer which is obtained through a reaction between a polyol compound and a polyvalent isocyanate compound, to react with a hydroxy group-containing (meth)acrylate or the like.

As the urethane acrylate oligomer of the present invention, one in which the aforementioned polyol compound is a polyether-based polyol or a polyester-based polyol, whereby it has a polyether structure or a polyester structure, is preferably used. In the present invention, in view of the fact that the urethane acrylate oligomer has a polyether structure or a polyester structure, the flexibility of the antistatic layer is readily exhibited.

Examples of the polyvalent isocyanate compound include isophorone diisocyanate, 2,4-tolylene diisocyanate, 2,6-tolylene diisocyanate, 1,3-xylylene diisocyanate, 1,4-xylylene diisocyanate, cliphenylmethane 4,4-diisocyanate, and the like. In addition, as the hydroxy group-containing (meth)acrylate, for example, 2-hydroxyethyl (meth)acrylate, 2-hydroxypropyl (meth)acrylate, 2-hydroxybutyl (meth)acrylate, polyethylene glycol (meth)acrylate, and the like are useful.

As the urethane acrylate oligomer, a combination of a plurality of these compounds may also be used.

A weight average molecular weight of the urethane acrylate oligomer is preferably 800 to 5,000. When the weight average molecular weight of the urethane acrylate oligomer is 5,000 or less, a crosslinking density thereof can be made high, the strength of the antistatic layer is improved, and the generation of a crack is readily prevented from occurring. In addition, when the weight average molecular weight is 800 or more, an excessive increase of the crosslinking density of the antistatic layer is prevented from occurring, and the flexibility of the coat layer is hardly lost. In addition, from such a viewpoint, the weight average molecular weight is more preferably in a range of 1,000 to 3,000.

In the present specification, the weight average molecular weight is a value as converted into standard polystyrene, which is measured by the gel permeation chromatography (GPC) method.

The curing component may include other component than the urethane acrylate oligomer within a range where the object of the present invention is not impaired. Examples of such other curing component include an epoxy acrylate oligomer, a low-molecular acrylate, and the like.

A proportion of the urethane acrylate oligomer in the curing component is typically 60 to 100 mass %, and preferably 80 to 100 mass %. The curing component may be composed of only a urethane acrylate oligomer.

It is preferred that the antistatic layer-forming composition does not contain a polymerizable monomer, such as an acrylic monomer, etc. In view of the fact that the antistatic layer-forming composition does not contain a polymerizable monomer, the strength of the antistatic layer is improved, whereby the generation of a crack is readily prevented from occurring.

<Metal Filler>

In the present invention, the metal filler gives an antistatic performance to the substrate for surface protective sheet. In the present invention, the metal filler means a filler of a metal simple substance or an alloy, or a metal oxide filler having conductivity, and is preferably a metal oxide filler. Though a shape of the metal filler is not particularly limited, it is preferably a particle. Though its average particle diameter is not particularly limited, for example, it is 0.005 to 5 μm, and preferably 0.01 to 1 μm. The average particle diameter is a value as measured by a particle size distribution measuring device (Microtrac UPA-150, manufactured by Nikkiso Co., Ltd.).

Examples of the metal oxide include tin oxide-based compounds, such as antimony-doped tin oxide (ATO), tantalum-doped tin oxide (TaTO), niobium-doped tin oxide (NbTO), fluorine-doped tin oxide (FTO), phosphorus-doped tin oxide (PTO), etc.; and metal oxides other than tin oxide-based compounds, such as tin-doped indium oxide (ITO), aluminum-doped zinc oxide (AZO), etc. These may be used solely, or may be used in combination of two or more thereof.

A tin oxide-based compound is preferably used as the metal filler. Above all, phosphorus-doped tin oxide is more preferably used because it is small in an environmental load and high in an antistatic performance.

The metal filler is blended in an amount of 55 mass % or more relative to a total mass of the curing component and the metal filler. In the present invention, when the blending amount of the metal filler is less than 55 mass %, the substrate for surface protective sheet cannot have a sufficient antistatic performance. In order to obtain a higher antistatic performance, the blending amount of the metal filler is preferably 65 mass % or more. In addition, in order that the metal filler may be appropriately held by the curing component, thereby allowing the substrate for surface protective sheet to readily maintain the sheet shape, an upper limit value of the blending amount of the metal filler is preferably 90 mass % or less, and more preferably 80 mass % or less.

<Photopolymerization Initiator>

The antistatic layer-forming composition may further contain a photopolymerization initiator. By containing a photopolymerization initiator, an irradiation dose and an irradiation time of energy rays necessary for polymerization and curing of the antistatic layer-forming composition can be reduced.

Examples of the photopolymerization initiator include benzophenone, acetophenone, benzoin, benzoin methyl ether, benzoin ethyl ether, benzoin isopropyl ether, benzoin isobutyl ether, benzoin benzoic acid, benzoin methyl benzoate, benzoin dimethyl ketal, 2,4-diethyl thioxanthone, 1-hydroxycyclohexyl phenyl ketone, benzyl diphenyl sulfide, tetramethylthiuram monosulfide, azobisisobutyronitrile, benzil, dibenzil, diacetyl, 2-chloroanthraquinone, 2,4,6-trimethylbenzoyldiphenylphosphine oxide, and the like. The photopolymerization initiator is used in a proportion of preferably 0.05 to 15 parts by mass, and more preferably 0.1 to 10 parts by mass relative to 100 parts by mass of the curing component.

The antistatic layer-forming composition of the present invention may be further blended with other additive as the need arises. In addition, though a thickness of the antistatic layer is not particularly limited, it is preferably 0.2 to 20 μm, and more preferably 0.5 to 10 μm.

In general, the antistatic layer-forming composition contains the aforementioned curing component and metal filler as main components, and a total content thereof is typically 80 mass % or more, preferably 90 mass % or more, and more preferably 95 mass % or more relative to the whole amount of the antistatic layer-forming composition. In addition, though the total amount of these main components may be 100 mass % or less relative to the whole amount of the composition, for example, in the case of containing the photopolymerization initiator, or other cases, the foregoing total amount is preferably 99.9 mass % or less. In the case where the antistatic layer-forming composition is diluted with a solvent or the like, which is volatilized in a production process thereof, the whole amount of the antistatic layer-forming composition refers to a value obtained by eliminating the diluent solvent or the like therefrom. The same is also application to the whole amount of a urethane-containing curing resin composition as mentioned later.

[Support Film]

As for the support film of the present invention, one capable of allowing the substrate for surface protective sheet to have a stress relaxation rate of 60% or more as mentioned later has only to be selected. In general, the support film is obtained by curing a curing resin composition, and it is preferably a cured urethane film obtained by curing a urethane-containing curing resin composition. The urethane-containing resin composition includes a resin component having a urethane bond, and it is preferably one containing a urethane acrylate oligomer or a non-reactive urethane polymer as mentioned later in detail, and more preferably one containing a urethane acrylate oligomer. By using the urethane acrylate oligomer for the support film, it becomes easy to regulate the crosslinking density of the support film through molecular weight regulation of the oligomer. In addition, by using the oligomer, the crosslinking density of the support film becomes relatively high, and even when the support film is blended with an antistatic agent, the antistatic performance is hardly improved. However, in the present invention, since the antistatic layer is provided, the antistatic performance can be thoroughly improved.

<Urethane Acrylate Oligomer>

As the urethane acrylate oligomer that is contained in the urethane-containing curing resin composition, it is preferred to use one selected from those exemplified above as the urethane acrylate oligomer for forming the antistatic layer. However, so far as its weight average molecular weight is concerned, in order to secure the high stress relaxation characteristics, one having a higher weight average molecular weight than the urethane acrylate oligomer for forming the antistatic layer is, in general, used. Specifically, the weight average molecular weight of the urethane acrylate oligomer for forming the support film is preferably 1,000 to 50,000, and more preferably 5,000 to 30,000. In addition, among those mentioned above, a urethane acrylate oligomer having a polyether structure or a polyester structure is preferably used, and a urethane acrylate oligomer having a polyester structure is more preferably used.

In the case where the urethane-containing curing resin composition contains a urethane acrylate oligomer, it is preferred to further contain an energy ray-polymerizable monomer. When the urethane-containing curing resin composition contains only the urethane acrylate oligomer, it is often difficult to undergo the film formation. However, when diluted with the energy ray-polymerizable monomer, the film forming properties are readily made favorable. In addition, various physical properties, such as flexibility, etc., are readily made favorable, too. The energy ray-polymerizable monomer is one having an energy ray-polymerizable double bond in a molecule thereof.

The urethane-containing curing resin composition preferably contains, as a main component, a mixture of an energy ray-polymerizable monomer and an energy ray-polymerizable urethane acrylate oligomer and is cured upon irradiation with energy rays.

Specific examples of the energy ray-polymerizable monomer include aromatic compounds, such as phenoxyethyl (meth)acrylate, p-cresol ethylene oxide-modified (meth)acrylate, o-cresol ethylene oxide-modified (meth)acrylate, m-cresol ethylene oxide-modified (meth)acrylate, phenyl ethylene oxide-modified (meth) acrylate, benzyl (meth)acrylate, 2-hydroxy-3-phenoxypropyl (meth) acrylate, etc.; alicyclic compounds, such as isobornyl (meth)acrylate, dicyclopentenyl (meth) acrylate, dicyclopentanyl (meth) acrylate, dicyclopentenyloxy (meth) acrylate, cyclohexyl (meth)acrylate, adamantane (meth)acrylate, etc.; and heterocyclic compounds, such as tetrahydrofurfuryl (meth) acrylate, morpholine acrylate, N-vinylpyrrolidone, N-vinylcaprolactam, etc.

In order to enhance the stress relaxation properties as mentioned later, a (meth)acrylate having a relatively highly bulky group is preferably used as the energy ray-polymerizable monomer. Among those mentioned above, isobornyl (meth)acrylate, 2-hydroxy-3-phenoxypropyl (meth)acrylate, and so on are more preferably used. In addition, a polyfunctional (meth)acrylate may be used as the energy ray-polymerizable monomer as the need arises.

The energy ray-polymerizable monomer is used in a proportion of preferably 5 to 900 parts by mass, more preferably 10 to 500 parts by mass, and especially preferably 30 to 200 parts by mass relative to 100 parts by mass of the urethane acrylate oligomer.

The urethane-containing curing resin composition containing the urethane acrylate oligomer may further contain a photopolymerization initiator. By containing the photopolymerization initiator, an irradiation dose and an irradiation time of energy rays necessary for polymerization and curing of the urethane-containing curing resin composition can be reduced. As the photopolymerization initiator, it is preferred to use one properly selected from those exemplified above as the photopolymerization initiator to be blended in the antistatic layer-forming composition. The photopolymerization initiator is used in a proportion of preferably 0.05 to 15 parts by mass, and more preferably 0.1 to 10 parts by mass relative to 100 parts by mass of a total amount of the urethane acrylate oligomer and the energy ray-polymerizable monomer.

<Non-Reactive Urethane Polymer>

In the case where the urethane-containing curing resin composition contains a non-reactive urethane polymer, it contains an energy ray-polymerizable monomer as a diluent. The urethane-containing curing resin composition is one composed of a mixture of these non-reactive urethane polymer and energy ray-polymerizable monomer as a main component and is cured upon irradiation with energy rays and subjected to film formation. The non-reactive urethane polymer means one which does not react with the energy ray-polymerizable monomer. The non-reactive urethane polymer is, for example, one obtained through a reaction between a polyol compound and a polyisocyanate in the energy ray-polymerizable monomer. For the reaction of a hydroxy group of the polyol compound with the polyisocyanate, a catalyst, such as dibutyltin dilaurate, etc., may be used.

As the polyol compound that is useful for the non-reactive urethane polymer, one having two or more hydroxy groups in one molecule is desired, and a polyether-based polyol, a polyester-based polyol, and a polycarbonate-based polyol are preferred.

Examples of the polyisocyanate that is useful for the non-reactive urethane polymer include aromatic, aliphatic, or alicyclic diisocyanates, dimers and trimers of these diisocyanates, and the like. Examples of the aromatic, aliphatic, or alicyclic diisocyanate include tolylene diisocyanate, diphenylmethane diisocyanate, hexamethylene diisocyanate, xylylene diisocyanate, hydrogenated xylylene diisocyanate, isophorone diisocyanate, hydrogenated diphenylmethane diisocyanate, naphthalene diisocyanate, phenylene diisocyanate, butane-1,4-diisocyanate, trimethylhexamethylene diisocyanate, cyclohexane-1,4-diisocyanate, dicyclohexylmethane-4,4-diisocyanate, 1,3-bis(isocyanatomethyl)cyclohexane, methylcyclohexane diisocyanate, tetramethylxylylene diisocyanate, and the like. In addition, dimers and trimers thereof, and polyphenylmethane polyisocyanate are also used. These polyisocyanates can be used solely or in combination of two or more thereof.

As the energy ray-polymerizable monomer that is used together with the non-reactive urethane polymer, one having an unsaturated double bond that is polymerizable upon irradiation with energy rays is used. From the standpoint of reactivity, an acrylic monomer is preferably used. Examples of the acrylic monomer that is preferably used include (meth)acrylic acid; various alkyl (meth)acrylates in which the carbon number of the alkyl group is about 1 to 12, such as methyl (meth)acrylate, ethyl (meth)acrylate, propyl (meth)acrylate, butyl (meth)acrylate, 2-ethylhexyl (meth)acrylate, octyl (meth)acrylate, nonyl (meth) acrylate, etc.; isobornyl (meth)acrylate; and hydroxy group-containing (meth) acrylates, such as 2-hydroxyethyl (meth) acrylate, 4-hydroxybutyl (meth)acrylate, etc. A monomer, such as vinyl acetate, vinyl propionate, styrene, acrylamide, methacrylamide, a mono- or diester of maleic acid, styrene and derivatives thereof, N-methylolacrylamide, glycidyl acrylate, glycidyl methacrylate, N,N-dimethylaminoethyl acrylate, N,N-dimethylaminopropyl methacrylamide, 2-hydroxypropyl acrylate, acryloyl morpholine, N,N-dimethylacrylamide, N,N-dietylacrylamide, imide acrylate, N-vinylpyrrolidone, an oligoester acrylate, ε-caprolactone acrylate, etc., may be used together with the foregoing acrylic monomer. In addition, a polyfunctional (meth)acrylate may be used as the need arises.

In the case of using the non-reactive urethane polymer, the urethane-containing curing resin composition may contain a photopolymerization initiator. As for the photopolymerization initiator, those exemplified above which can be blended in the antistatic layer-forming composition may be properly selected and used, or other conventionally known photopolymerization initiator may also be used.

<Other Additives>

The curing resin composition for forming a support film may be further blended with other additives. For example, in order to make the antistatic performance of the substrate for surface protective sheet more favorable, an antistatic agent, such as a metal salt antistatic agent, etc., may be blended. It is preferred to use a lithium salt-based antistatic agent as the metal salt antistatic agent.

A thickness of the support film is regulated according to a performance required by the substrate for surface protective sheet, or the like, and it is preferably 20 to 300 μm, and more preferably 50 to 200 μm.

As mentioned previously, though the urethane-containing curing resin composition is preferably composed of, as a main component, at least one of an energy ray-polymerizable urethane acrylate oligomer and a non-reactive urethane polymer as well as an energy ray-polymerizable monomer which is blended, if desired, the total amount of these materials is typically 80 mass % or more, preferably 90 mass % or more, and more preferably 95 mass % or more relative to the whole amount of the urethane-containing curing resin composition. In addition, though the total amount of these materials may be 100 mass % or less relative to the whole amount of the composition, for example, in the case of containing a photopolymerization initiator, or other cases, the foregoing total amount is preferably 99.9 mass % or less.

[Stress Relaxation Rate of Substrate for Surface Protective Sheet]

A stress relaxation rate of the substrate for surface protective sheet of the present invention is 60% or more. When the stress relaxation rate is less than 60%, when the back face of the wafer is ground and made thin, there would be a concern that warpage or a crack, or the like is generated in the wafer. From the viewpoint of more preventing warpage or a crack of the wafer from occurring, the stress relaxation rate of the substrate for surface protective sheet of the present invention is preferably 70 to 100%, and more preferably 75 to 95%.

In the present invention, though there is no particular limitation, when the support film is a cured urethane film as mentioned previously, the stress relaxation rate can be allowed to fall within the aforementioned range. In the present invention, the stress relaxation rate refers to a stress relaxation rate after one minute when the substrate is extended by 10% and is one measured by the measurement method as described later.

[Young's Modulus of Substrate for Surface Protective Sheet]

A Young's modulus of the substrate for surface protective sheet is preferably in the rage of 10 to 1,000 MPa, and more preferably in the range of 40 to 200 MPa. When the Young's modulus falls within the foregoing range, a supporting performance of the substrate for surface protective sheet can be made favorable. In addition, the Young's modulus of the substrate for surface protective sheet is especially preferably 100 MPa or less. When the Young's modulus is 100 MPa or less, an effect for preventing warpage is readily maintained high.

[Production Method of Substrate for Surface Protective Sheet]

Though the substrate for surface protective sheet of the present invention is not particularly limited, it is, for example, produced by the following method.

Firstly, the support film-forming composition (for example, the urethane-containing curing resin composition) is coated on a release film by a casting method or the like, and the support film-forming composition is then semi-cured, thereby forming a support film intermediate material on the release film. In addition, separately, the antistatic layer-forming composition which has been diluted with an organic solvent or the like, if desired is coated on a release film, and the resultant is dried as need arises, thereby forming a film for antistatic layer on the release film.

Subsequently, the film for antistatic layer formed on the release film and the support film intermediate material formed on the release film are superimposed each other, and the film for antistatic layer and the support film intermediate material are then cured, whereby the substrate for surface protective sheet in which an antistatic layer is provided on one face of the support film can be obtained. The two release films are properly released as the need arises.

In the present invention, as mentioned previously, the support film-forming composition and the antistatic layer-forming composition are preferably curable with energy rays. In that case, curing of the support film and the antistatic layer is performed using energy rays, such as ultraviolet rays, electron beams, etc.

(Surface Protective Sheet)

Figure 2:
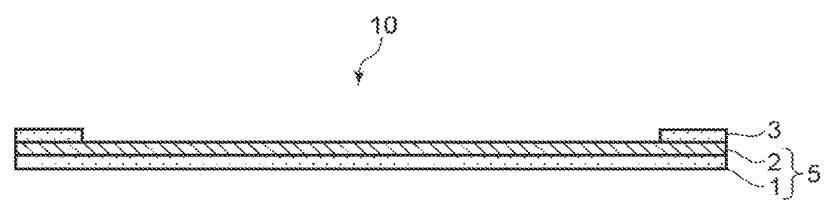
FIG. 2 shows another embodiment of a surface protective sheet of the present invention.
Figure 3:
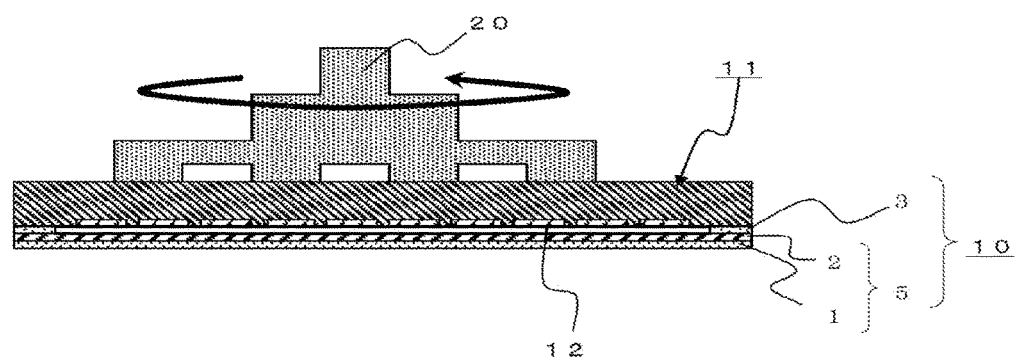
FIG. 3 is a schematic cross-sectional view showing an example of a surface protective sheet of the present invention and its use method.

Next, the surface protective sheet of the present invention is described while referring to FIGS. 1 to 3.

As shown in FIGS. 1 and 2, a surface protective sheet 10 is constructed of a substrate 5 for surface protective sheet including a support film 1 and an antistatic layer 2 provided on the support film 1, and a pressure sensitive adhesive part 3 provided on any one face of the substrate 5 for surface protective sheet. Though the pressure sensitive adhesive part 3 is preferably one constructed of a single-layer pressure sensitive adhesive layer, it has only to be one in which the surface protective sheet 10 is stuck onto an adherend, such as a pressure sensitive adhesive double coated tape in which a pressure sensitive adhesive layer is formed on both faces of a core material film, etc.

Here, as shown in FIGS. 1 and 2, the pressure sensitive adhesive part 3 is preferably provided on the face on which the antistatic layer 2 of the substrate 5 for surface protective sheet is provided. According to this, when the surface protective sheet 10 is stuck onto an adherend (for example, a semiconductor wafer 11), the antistatic layer 2 is disposed on the adherend side as compared with the support film 1, and therefore, releasing electrification on releasing the surface protective sheet 10 from the adherend can be effectively prevented from occurring. However, the pressure sensitive adhesive part 3 may be provided on a face on the opposite side to the face on which the antistatic layer 2 is provided. Though the pressure sensitive adhesive part 3 of the present invention may be provided on the entirety of the substrate 5 for surface protective sheet as shown in FIG. 1, it may also be provided in a part of the substrate 5 for surface protective sheet as shown in FIG. 2.

As for the surface protective sheet 10 of the present invention, for example, the adherend is a material to be processed to which predetermined processing is applied, and the surface protective sheet 10 is stuck onto the adherend surface through the pressure sensitive adhesive part 3, thereby protecting the adherend surface. More specifically, the surface protective sheet 10 of the present invention is stuck onto a surface of the semiconductor wafer 11, thereby protecting a circuit 12 or the like provided on a front face of the semiconductor wafer 11.

Preferably, as shown in FIG. 3, the surface protective sheet 10 is used as, for example, a back grind tape for protecting the front face of the semiconductor wafer 11 when a back face of the semiconductor wafer is ground by a grinder 20; however, it may also be used for other applications. Though a thickness of the semiconductor wafer after back face grinding is not particularly limited, it is, for example, about 1 to 300 μm, and preferably about 10 to 100 μm.

For example, when the surface protective sheet 10 is released from the wafer front face after back face grinding, in a conventional surface protective sheet, there would be a possibility that the wafer is adversely affected by releasing electrification. However, in the present invention, by using the substrate 5 for surface protective sheet with a favorable antistatic performance, the electrification can be appropriately prevented from occurring. In addition, in the surface protective sheet 10 of the present invention, as mentioned previously, the stress relaxation rate of the substrate 5 for surface protective sheet is high, and therefore, even when the wafer 11 is made ultrathin by back face grinding, warpage or a crack, or the like is not generated in the wafer 11.

In FIG. 3, an example in which the pressure sensitive adhesive part 3 is formed in a part of the surface protective sheet 10 is shown; however, the same is also applicable to the case where the pressure sensitive adhesive part 3 is provided on the entirety of the surface protective sheet 10.

Examples of a pressure sensitive adhesive that forms the pressure sensitive adhesive layer include acrylic-based, rubber-based, silicone-based, and polyvinyl ether pressure sensitive adhesives, and the like. For example, in the case where the pressure sensitive adhesive part is constructed of a single-layer pressure sensitive adhesive layer, the pressure sensitive adhesive layer can be formed by laminating the pressure sensitive adhesive on the substrate 5 for surface protective sheet by a known method.

As the pressure sensitive adhesive, energy ray-curable type, heat foaming type, and water-swellable type pressure sensitive adhesives can be used. Of those, an energy ray-curable type pressure sensitive adhesive is preferably used. In addition, examples of the energy ray-curable type pressure sensitive adhesive include ultraviolet ray-curable type and electron beam-curable type pressure sensitive adhesives, and a ultraviolet ray-curable type pressure sensitive adhesive is especially preferred. When the energy ray-curable type pressure sensitive adhesive is used, the surface protective sheet is stuck onto the semiconductor wafer with high adhesion, whereas when it is released from the semiconductor wafer, the adhesion can be lowered upon irradiation with energy rays. For that reason, when the surface protective sheet is released while appropriately protecting a circuit or the like of the semiconductor wafer, breakage of the circuit of the semiconductor wafer front face or transfer of the pressure sensitive adhesive onto the semiconductor wafer is prevented from occurring.

Though a thickness of the pressure sensitive adhesive part 3 may be properly regulated according to a height or the like of the circuit provided on the semiconductor wafer onto which the surface protective sheet is stuck, in the case where the pressure sensitive adhesive part 3 is formed of a single-layer pressure sensitive adhesive layer, the thickness of the pressure sensitive adhesive part 3 is preferably about 3 to 100 μm, more preferably about 5 to 50 μm, and still more preferably about 7 to 30 μm. By regulating the thickness of the pressure sensitive adhesive part 3 to a lower limit value thereof or more, the adhesion is readily obtained, and a protective function can be secured. In addition, by regulating the thickness of the pressure sensitive adhesive part 3 to an upper limit value thereof or less, the pressure sensitive adhesive part 3 can be formed of a single-layer pressure sensitive adhesive layer with ease.

A pressure sensitive adhesive double coated tape in which a pressure sensitive adhesive layer is formed on both faces of a core material film may also be used. A thickness of the pressure sensitive adhesive double coated tape is preferably about 5 to 300 μm, and more preferably about 10 to 200 μm.

In the present invention, the case where the thickness of the pressure sensitive adhesive part 3 is 30 μm or less is especially suitable. When the thickness is 30 μm or less, in the case of sticking the surface protective sheet onto the semiconductor wafer, the substrate for surface protective sheet and the semiconductor wafer front face become close to each other. When the both become close to each other in the above manners, releasing electrification of the surface protective sheet is liable to be generated. However, in the present invention, the substrate for surface protective sheet has a high antistatic performance, and therefore, the generation of releasing electrification can be thoroughly inhibited.

In the case where the pressure sensitive adhesive part 3 of the present invention is provided in a part of the substrate 5 for surface protective sheet, for example, there may be adopted such a way that the surface protective sheet is designed so as to have a shape approximately equal to a material to be processed that works as the adherend (a circle in the case of the semiconductor wafer), and the pressure sensitive adhesive part is provided only in a periphery thereof to form a pressure sensitive adhesive part region, whereas a region to be surrounded by the foregoing pressure sensitive adhesive part region is formed as a region where the pressure sensitive adhesive part is not provided (non-pressure sensitive adhesive part region). According to that, when the surface protective sheet 10 is, for example, stuck onto the semiconductor wafer 11 as shown in FIG. 3, the non-pressure sensitive adhesive part region is opposed to the region in which the circuit 12 in the center of the semiconductor wafer 11 is formed (circuit-forming region), and the pressure sensitive adhesive part region is bonded to the periphery where the circuit 12 of the semiconductor wafer 11 is not formed. The non-pressure sensitive adhesive part region assumes a shape corresponding to the shape of the wafer 11, and in general, it is formed in a circular form, whereas the pressure sensitive adhesive part region is formed in a ring-shaped form.

In the surface protective sheet 10, where the pressure sensitive adhesive part is provided in a part of the surface thereof, and the non-pressure sensitive adhesive part region is provided, the antistatic layer 2 having a metal filler blended therein is exposed outside, and the exposed antistatic layer 2 is opposed to the adherend surface. For that reason, the antistatic effect of the antistatic layer 2 is not diminished by the presence of the pressure sensitive adhesive part 3, and the releasing electrification generated when the surface protective sheet 10 is released from the adherend is effectively reduced. In addition, in view of the fact that the non-pressure sensitive adhesive part region is provided, bonding of the pressure sensitive adhesive part 3 to the circuit-forming region of the wafer center is prevented from occurring, and therefore, a fault to be caused due to transfer of the pressure sensitive adhesive onto the circuit 12 is hardly generated.

In the case where the pressure sensitive adhesive part 3 is partially provided, it is preferred that the pressure sensitive adhesive part 3 is formed through processing, such as punching, etc., before being laminated on the substrate for surface protective sheet. The punching processing is, for example, performed in such a manner that a laminate in which a release film is laminated on both faces of the pressure sensitive adhesive part is first prepared and then punched out in a shape in which the pressure sensitive adhesive part and the one-sided release film are in conformity with the non-pressure sensitive adhesive part region. Then, after the punched-out portion of the pressure sensitive adhesive part and the one-sided release film are released, the pressure sensitive adhesive part is stuck onto the substrate for surface protective sheet, and the surface protective sheet is formed.

EXAMPLES

The present invention is hereunder described in more detail based on Examples, but it should be construed that the present invention is by no means limited by these Examples.

Evaluation methods and measurement methods of respective physical properties in the present invention are as follows.

<Stress Relaxation Rate>

A specimen of a substrate for surface protective sheet as cut out in a strip shape having a width of 15 mm was measured using Tensilon RTA-100, manufactured by Orientec Corporation. Specifically, both ends of the specimen were held by chucks such that a length between the chucks was 100 mm, and the specimen was drawn at a rate of 200 mm/min at room temperature (23° C.). From a stress A at the time of 10% extension and a stress B one minute after stopping of extension, a stress relaxation rate was calculated according to an expression: (A−B)/A×100(%).

<Young's Modulus>

A Young's modulus of a substrate for surface protective sheet was measured using a universal tensile tester (Tensilon RTA-T-2M, manufactured by Orientec Corporation) in conformity with JIS K7161:1994 in an environment at 23° C. and a humidity of 50% at a drawing rate of 200 mm/min.

<Weight Average Molecular Weight>

A weight average molecular weight Mw as converted into standard polystyrene was measured by the gel permeation chromatography (GPC) method.

Measuring instrument: To a high-speed GPC instrument "HLC-8120GPC", manufactured by Tosoh Corporation, high-speed columns "TSK guard column $H_{XL}$-H", "TSK Gel $GMH_{XL}$", and "TSK Gel G2000 $H_{XL}$" (all of which are manufactured by Tosoh Corporation) were connected in this order, and the measurement was performed.

Column temperature: 40° C.
  Liquid sending speed: 1.0 mL/min
  Detector: Differential refractive index meter <Releasing Electrification>

A surface protective sheet obtained in each of the Examples and Comparative Examples was stuck onto a wafer circuit face to prepare a laminate of the wafer and the surface protective sheet, and the laminate was allowed to stand in an environment at a temperature of 23° C. and a humidity of 50% RH for 30 days. Subsequently, using Adwill RAD-2700, manufactured by Lintec Corporation, the surface protective sheet was subjected to UV irradiation from an annexed UV irradiator under conditions at a luminance of 230 mW and a quantity of light of 1,000 mJ, and thereafter, the surface protective sheet was released from the wafer at a rate of 500 mm/min. At this time, a charge potential charged on the surface protective sheet was measured in a distance of 50 mm from the wafer front face using a current collecting potential measurement instrument (KSD-6110, manufactured by Kasuga Electric Works Ltd.) in an environment at 23° C. and a humidity of 50% RH (measurement lower limit: 0.1 kV).

<Crack of Antistatic Layer>

A surface protective sheet prepared in each of the Examples and Comparative Examples was stuck onto a circuit-formed face of a 12-inch silicon wafer having a thickness of 750 μm by using a tape mounter (Adwill RAD-3510, manufactured by Lintec Corporation). The wafer was ground with a grinder (DGP-8760, manufactured by DISCO Corporation) to an extent of 50 μm; thereafter, the surface protective sheet was released from the wafer; the antistatic layer face was observed with a digital microscope, thereby confirming the presence or absence of a crack of the antistatic layer.

<Warpage of Wafer after Grinding>

A surface protective sheet prepared in each of the Examples and Comparative Examples was stuck onto a silicon wafer (300 mmφ, thickness: 750 μm) by using a tape mounter (Adwill RAD-3500, manufactured by Lintec Corporation). Thereafter, the resulting wafer was ground with a grinder (DFD-840, manufactured by DISCO Corporation) to an extent that the thickness of silicon wafer was 150 μm. After grinding, without removing the surface protective sheet, the wafer was placed, with its surface protective sheet up, on a first class planarity surface plate for precision inspection in conformity with JIS B7513:1992.

The measurement was performed at 17 measuring points, with the surface plate regarded as zero spot, and a maximum value thereof was defined as a warpage amount. The case where the warpage amount was 5 mm or more was evaluated as "yes" of warpage, and the case where the warpage amount was less than 5 mm was evaluated as "no" of warpage.

Example 1

(Preparation of Support Film Intermediate Material)

A urethane-containing curing resin composition composed of 50 parts by mass of a bifunctional urethane acrylate oligomer (weight average molecular weight: 12,000) obtained by adding a 2-hydroxyethyl acrylate to an end of a urethane oligomer synthesized from a polyester-based polyol having a molecular weight of 2,000 and isophorone diisocyanate, a mixture of 25 parts by mass of isobornyl acrylate and 25 parts by mass of 2-hydroxy-3-phenoxypropyl acrylate as energy ray-polymerizable monomers, and 1 part by mass of a photopolymerization initiator (DAROCURE 1173, manufactured by BASF SE) was coated and expanded on a release film, and then preliminarily cured upon irradiation with ultraviolet rays (230 mW, 1,000 mJ), thereby forming a support film intermediate material having a thickness of 100 μm on the release film.

(Preparation of Film for Antistatic Layer)

A solution having 100 parts by mass (as converted into a solid content, thereinafter the same) of a curing component composed of a urethane acrylate oligomer having a polyester structure (weight average molecular weight: 2,000) dissolved in an organic solvent and a liquid dispersion having 230 parts by mass of phosphorus-doped tin oxide having an average particle diameter of 0.1 μm dispersed in an organic solvent were mixed; 2 parts by mass of a photopolymerization initiator (IRGACURE 184, manufactured by BASF SE) was further blended; and the blend was diluted with methyl ethyl ketone until a mass proportion of the solid content of the whole was 20%, thereby obtaining an antistatic layer-forming composition. This antistatic layer-forming composition was coated on one face of a newly prepared release film and dried at 100° C. for one minute, thereby forming a film for antistatic layer having a thickness of 2 μm on the release film.

(Preparation of Substrate for Surface Protective Sheet)

The film for antistatic layer formed on the release film and the support film intermediate material formed on another release film were stuck onto each other such that these came into intimate contact with each other, and ultraviolet rays were irradiated under conditions at 230 mW and 1,000 mJ, thereby not only curing the film for antistatic layer but also curing the support film intermediate material. Thereafter, the release film on the antistatic layer side was released, thereby obtaining a release film-provided substrate for surface protective sheet. The evaluation results of the substrate for surface protective sheet are shown in Table 1. The respective evaluations are ones after releasing the release film.

(Preparation of Surface Protective Sheet)

On the face on which the antistatic layer of the substrate for surface protective sheet, a ultraviolet ray-curable type pressure sensitive adhesive was partially laminated in a thickness of 20 μm, thereby forming a pressure sensitive adhesive layer. Thereafter, the release sheet on the support film intermediate material side was released to prepare a surface protective sheet. Here, the pressure sensitive adhesive layer was one of a circle having an outer diameter of 300 mm, in which a ring-shaped pressure sensitive adhesive region was formed only in a range of 5 mm from the periphery thereof, and a non-pressure sensitive adhesive part region thereof was circular. The results of the respective evaluations of the surface protective sheet are shown in Table 1.

Example 2

The same procedures as in Example 1 were carried out, except that the urethane acrylate oligomer to be blended in the antistatic layer-forming composition was changed to a bifunctional urethane acrylate oligomer (weight average molecular weight: 2,000) having a urethane oligomer structure, which was synthesized from a polyether-based polyol and isophorone diisocyanate.

Example 3

The same procedures as in Example 1 were carried out, except that the blending amount of the phosphorus-doped tin oxide was changed to 150 parts by mass relative to 100 parts by mass of the curing component.

Comparative Example 1

The same procedures as in Example 1 were carried out, except that the blending amount of the phosphorus-doped tin oxide was changed to 100 parts by mass relative to 100 parts by mass of the curing component.

Comparative Example 2

The same procedures as in Example 1 were carried out, except that the urethane acrylate oligomer in the antistatic layer-forming composition was changed to an epoxy acrylate oligomer (weight average molecular weight: 2,000).

Comparative Example 3

The urethane acrylate oligomer in the antistatic layer-forming composition was changed to an epoxy acrylate oligomer (weight average molecular weight: 2,000). In addition, the same procedures as in Example 1 were carried out, except that the support film was changed to the following one, and the antistatic layer-forming composition was coated directly onto the support film, followed by drying at 100° C. for one minute to obtain a substrate for surface protective sheet.

Support film: A polyolefin-based film in which a 10 μm-thick surface layer composed of low-density polyethylene was provided on both faces of a 60 μm-thickness intermediate layer composed of polypropylene.

TABLE 1

| | Substrate for surface protective sheet | | | | | | | |
|---|---|---|---|---|---|---|---|---|
| | Stress relaxation rate (%) | Young's modulus (MPa) | Antistatic layer | | | Releasing electrification (V) | Warpage | Crack |
| | | | Thickness (μm) | Filler (mass %) | Curing component Kind | | | |
| Example 1 | 85 | 80 | 2 | 70 | UA(ES) | 35 | No | No |
| Example 2 | 85 | 80 | 2 | 70 | UA(ET) | 50 | No | No |
| Example 3 | 85 | 80 | 2 | 60 | UA(ES) | 200 | No | No |
| Comparative Example 1 | 85 | 80 | 2 | 50 | UA(ES) | 900 | No | No |
| Comparative Example 2 | 85 | 80 | 2 | 70 | EA | 700 | No | Yes |
| Comparative Example 3 | 40 | 480 | 2 | 70 | EA | 110 | Yes | No |

* In Table 1, the mass % of the filler indicates a mass % of the metal filler relative to a sum total of the curing component and the metal filler.
* The curing component in Table 1 is as follows.
UA(ES): Polyester-based urethane acrylate oligomer
UA(ET): Polyether-based urethane acrylate oligomer
EA: Epoxy acrylate oligomer As is clear from the results of Table 1, in Examples 1 to 3, by using the urethane acrylate oligomer as the curing component of the antistatic layer and regulating the stress relaxation rate of the substrate for surface protective sheet to 60% or more, even in the case of using a relatively large amount of the metal filler, not only the releasing electrification could be reduced by preventing the generation of a crack in the antistatic layer from occurring, but also the generation of warpage in the wafer could be prevented from occurring.

On the other hand, in Comparative Example 1, the use amount of the metal filler was small, so that the releasing electrification could not be thoroughly reduced. In addition, in Comparative Example 2, though a large amount of the metal filler was used, since the urethane acrylate oligomer was not used as the curing component, the crack was generated in the antistatic layer, so that the releasing electrification could not be thoroughly reduced. In addition, in Comparative Example 3, since the stress relaxation rate of the substrate for surface protective sheet was low, the warpage was generated in the wafer having the surface protective sheet stuck thereonto.

REFERENCE SIGNS LIST

1: Support film
2: Antistatic layer
3: Pressure sensitive adhesive part
5: Substrate for surface protective sheet
10: Surface protective sheet
11: Semiconductor wafer
12: Circuit
20: Grinder

The invention claimed is:

1. A surface protective sheet, comprising a pressure sensitive adhesive part on a substrate, the substrate comprising a support film and an antistatic layer provided on one face of the support film, wherein:

the pressure sensitive adhesive part is provided on a face on the side of the substrate on which the antistatic layer is provided;

a stress relaxation rate of the substrate is 60% or more, as determined by extending the substrate at a rate of 200 mm/min at a temperature of 23° C., and measuring a stress A at a time of 10% extension and a stress B one minute after stopping the extension, wherein the stress relaxation rate is given by an expression of (A−B)/A× 100(%);

the antistatic layer is formed by curing an antistatic layer-forming composition comprising a curing component and a metal filler;

a content of the metal filler is 55 mass % or more relative to a total mass of the curing component and the metal filler; and the curing component comprises a urethane acrylate oligomer.

2. The surface protective sheet according to claim 1, wherein the urethane acrylate oligomer is selected from the group consisting of a urethane acrylate oligomer having a polyester structure and a urethane acrylate oligomer having a polyether structure.

3. The surface protective sheet according to claim 1, wherein the support film is a cured urethane film obtained by curing a urethane-containing curing resin composition.

4. The surface protective sheet according to claim 3, wherein the urethane-containing curing resin composition comprises a urethane acrylate oligomer.

5. The surface protective sheet according to claim 1, wherein the metal filler is a metal oxide filler.

6. The surface protective sheet according to claim 5, wherein the metal oxide filler is a particle of phosphorus-doped tin oxide.

* * * * *